United States Patent
Yang et al.

(10) Patent No.: US 8,082,477 B2
(45) Date of Patent: Dec. 20, 2011

(54) METHOD OF MEMORY BUILD-IN SELF-TEST

(75) Inventors: Xiu Yang, Chengdu (CN); Dujuan Tang, Chengdu (CN)

(73) Assignee: IPGoal Microelectronics (SiChuan) Co., Ltd., High-Tech Incubation Park, Chengdu Sichuan Province (CN)

( * ) Notice: Subject to any disclaimer, the term of this patent is extended or adjusted under 35 U.S.C. 154(b) by 397 days.

(21) Appl. No.: 12/475,521

(22) Filed: May 31, 2009

(65) Prior Publication Data

US 2010/0042879 A1    Feb. 18, 2010

(30) Foreign Application Priority Data

Aug. 14, 2008  (CN) .......................... 2008 1 0045810

(51) Int. Cl.
*G01R 31/28* (2006.01)
(52) U.S. Cl. ........................ 714/733; 714/718
(58) Field of Classification Search ................. 714/722, 714/723, 746, 733, 718
See application file for complete search history.

(56) References Cited

U.S. PATENT DOCUMENTS

| 5,091,908 | A | * | 2/1992 | Zorian | 714/722 |
| 7,441,165 | B2 | * | 10/2008 | Tseng et al. | 714/718 |
| 2004/0193984 | A1 | * | 9/2004 | Soundron | 714/733 |
| 2006/0090105 | A1 | * | 4/2006 | Woods | 714/718 |

* cited by examiner

*Primary Examiner* — David Ton

(57) ABSTRACT

The present invention discloses a memory build-in self-test comprising steps of: (a) determining whether there is redundant address in the ROM; (b) when there is redundant address for storing standard check code, transferring the coefficient file in the ROM to a predetermined format; (c) producing a self-test logic and a standard check code corresponding to the ROM via design tool; (d) writing the standard check code into the redundant address and generating a new ROM. The present invention can assure that the standard check code and coefficient can be simply revised via corresponding way of Mask Change, so as to detect the damages of ROM by using memory build-in self-test (MBIST) which does not need to remake a whole set of Mask to revise the standard check code outside the ROM, so as to save cost and time, and lower the difficulty to update the product.

5 Claims, No Drawings

METHOD OF MEMORY BUILD-IN SELF-TEST

BACKGROUND OF THE PRESENT INVENTION

1. Field of Invention

The present invention relates to a field of memory build-in self-test (MBIST) in the IC design, and more particularly to a build-in self-test for a memory that can be repeatedly used after ROM coefficient is modified via photo mask change.

2. Description of Related Arts

With the decreasing size of the semiconductor processing, the scale of IC design is becoming larger and larger. The highly complex IC product is facing the challenge of the high liability, high quality, low cost, and shorter manufacturing period. On one hand, with the decreasing size of the semiconductor processing, the defect types of the embedded memory that may exist become more and more; on the other hand with the increasing complexity of the IC product, more ROMs will be embedded into the IC product. Therefore, the test for memory is needed. Using memory build-in self-test (MBIST) has a lot of advantages. Firstly, the MBIST can realize the automatization of the testability design, and automatically realize the universal memory test algorithm, so as to improve the test quality and lower the test cost; secondly, the MBIST circuit can perform "full speed" test by utilizing the system clock, so as to cover more defects and reduce the testing time; lastly, the MBIST can provide self-diagnosis and self-repairing function for each memory unit. Besides, the initialization vector of the MBIST can be performed at very low cost test equipment. Therefore, for high test quality and low test cost, the MBIST is the main stream technique of the present embedded memory test technique.

The IC layout is only some images or/and data. In order to turn the design result into reality, mask making process has to be taken first. The layout is a set of images, which is actually a plurality of layers of images. This process is similar to the overprint technique of the printing process. The object of the mask making is to produce a set of multilayer layout mask for the further image transfer, which means transfer the layout onto the silicon wafer to be prepared. Usually, a set of layout mask has several decade layers. For example, a general IC design needs twenty-eight layer masks, if it is taped out at IC manufacturer. The complexity and the manufacturing period of the IC processing are greatly influenced by the number of the mask layers.

Generally, during the engineering sample production or the mass production, if partial defect of the design needs to be modified or partial design need to be optimized, it can be done by changing one or a few layers of mask, namely "Mask Change", so as to effectively reduce the time for design update and accelerate the marketing of the product. Also, there is no need to change the whole mask due to some small design modifications, so as to save the design cost. However, the circuit that can be changed or optimized via mask change is usually simple or the change is small. In such case, the mask change can be accomplished manually with the aid of software. If the change is big, a decade or even several decades of masks need to be changed, mask change is not worthy. However, ROM is different from general IC hardware circuit. It can be generated directly through the Memory Complier provided by the IC manufacturer, so that when the size and depth of ROM is unchanged, all coefficients can be freely modified by changing only one layer of mask. Therefore, many companies like to put the software program into the ROM, and during the production, only one simple mask change can upgrade the corresponding software program.

In the present MBIST method, generally put the coefficient or software program into the ROM, and put the standard check code produced by corresponding design tool, such as MbistArchitect of Mentor, into the hardware circuit outside the ROM. During the MBIST process, the hardware circuit outside the ROM read out all the coefficient of the ROM, and generate one specific check code via the MBIST algorithm in the hardware circuit. Compare the specific check code with the standard check code stored in the hardware circuit outside the ROM, so as to determine whether the ROM is damaged during the physical manufacturing process at the IC manufacturer.

When the width and depth of the ROM is unchanged, the MBIST algorithm circuit is the same. However, once the coefficient of the ROM changes, the corresponding standard check code changes. For the chip that all layers of mask have been finished, revising the standard check code stored in the hardware circuit outside the ROM via Mask Change is difficult and risky, and even has no credibility. Therefore, when the coefficient needs to be revised or the software program needs to be upgraded, in order to perform the MBIST, all the masks have to be taped out again, which waste money and time.

SUMMARY OF THE PRESENT INVENTION

In order to solve the above technique problems, the present invention provide a build-in self-test method for a memory that can be repeatedly used after ROM coefficient is modified via mask change.

Accordingly, the present invention provides a memory build-in self-test comprising steps of:

(a) determining whether there is redundant address in the ROM;

(b) when there is redundant address for storing standard check code, transferring the coefficient file in the ROM to a predetermined format;

(c) producing a self-test logic and a standard check code corresponding to the ROM via design tool;

(d) writing the standard check code into the redundant address and generating a new ROM.

The predetermined format is a format that the software tool needs to transfer the coefficient file.

However, during the programming of the design tool, the control of the ROM Read and Write address should block the definition of the redundant Read and Write address needed for storing check code, that is to say, in the control of the ROM Read and Write address, set the largest address to the difference value between the actual size of the ROM and the size for storing standard check code, and do not describe the address for storing standard check code, so as to achieve a function of blocking.

The design tool may be MbistArchitect of Mentor, and MbistArchitect produces self-test logic and standard check code corresponding to ROM.

The self-test logic is the algorithm circuit of memory build-in self-test (MBIST).

New ROM can be produced by memory producing tool provided by IC manufacturer.

The benefit of the present invention is illustrated as below.

The present invention can assure that the standard check code and coefficient can be simply revised via Mask Change, so as to detect the damages of ROM by using memory build-in self-test (MBIST), which does not need to remake a whole set of Mask to revise the standard check code outside the ROM, so as to save cost and time, and lower the difficulty to update the product.

DETAILED DESCRIPTION OF THE PRESENT EMBODIMENT

EXAMPLE I

A build-in self-test method for a memory that can be repeatedly used after ROM coefficient is modified via mask change comprises the following steps. Firstly, determine whether there is redundant address in the ROM. When there is redundant address for storing standard check code, transfer the coefficient file in the ROM to a predetermined format. Then produce a self-test logic and a standard check code corresponding to the ROM via design tool. Lastly write the standard check code into the redundant address and generate a new ROM.

For example, there are 120 coefficients needed to be put into the ROM, but 128 ROM addresses are generated, which means the ROM has 8 redundant addresses for storing standard check code.

The predetermined format is a format that the software tool needs to transfer the coefficient file, such as the format the MbistArchitect of Mentor needs. The format is hexadecimal address/hexadecimal coefficient.

during the programming of the design tool software script, the control of the ROM Read and Write address should block the definition of the redundant Read and Write address needed for storing check code, that is to say, in the control of the ROM Read and Write address, set the largest address to the difference value between the actual size of the ROM and the size for storing standard check code, and do not describe the address for storing standard check code, so as to achieve a function of blocking.

The design tool may be MbistArchitect of Mentor, and MbistArchitect produces self-test logic and standard check code corresponding to ROM.

The self-test logic is the algorithm circuit of memory build-in self-test (MBIST).

New ROM can be produced by memory producing tool provided by IC manufacturer.

EXAMPLE II

In order to design a ROM A with a depth (address) of 256, 240 coefficients in the coefficient file (romA_cof.txt) to be stored, and a bit width of 32, perform the following steps.

1. Determine the redundant address that can store 32 bit standard check code, because the ROM A has a depth of 256 and 240 coefficients to be stored.

2. Transfer the coefficient file romA_cof.txt to the format that MbistArchitect needs, such as 011A/01B74C7F. Because the ROM A has a bit width of 32, 1 address of the ROM A is needed for storing 32 bit standard check code. In the design tool software script, block the last address (255) of the Read and Write address of the ROM A, that is to say, set the largest address to 254 in the control of the Read and Write address of the ROM A. (The Read and Write address range of the memory is 0-254.)

3. Produce self-test logic via MbistArchitect of Mentor, including 4 files: Compressor_lib.v, romA_bist.v, romA_bist_con.v, romA_tb.v.

4. Obtain 32 bit standard check code in romA_tb.v, write it into the last line of the romA_cof.txt, and produce romA by using memory producing tool DROM_HSD.

EXAMPLE III

In order to design a ROM B (romB) with a depth of 128, 120 coefficients in the coefficient file (romB_cof.txt) to be stored (the coefficient file with 120 coefficients has been transferred the needed format, namely hexadecimal address/hexadecimal coefficient), and a bit width of 8, perform the following steps.

1. Determine the redundant address that can store 32 bit standard check code, because the ROM B (romB) has a depth of 128 and 120 coefficients to be stored.

2. Because the ROM B (romB) has a bit width of 8, 4 addresses of the ROM B are needed for storing 32 bit standard check code. In the design tool software script, block the last 4 address (124-127) of the Read and Write address of the ROM B, that is to say, set the largest address to 123 in the control of the Read and Write address of the ROM B. (The Read and Write address range of the memory is 0-123.)

3. Produce self-test logic via MbistArchitect of Mentor, including 4 files: Compressor_lib.v, romB_bist.v, romB_bist_con.v, romB_tb.v.

4. Obtain 32 bit standard check code such as 32 'h45f64f3b, write it into the last 4 lines of the romB_cof.txt (divide the 32 bit into 4 lines with 8 bit per line, and write top 8 bit into the address 124 and bottom 8 bit into the address 127), and produce romB by using memory producing tool DROM_HSD.

EXAMPLE IV

In order to design a ROM C (romC) with a depth of 64, 60 coefficients in the coefficient file (romC_cof.txt) to be stored (the coefficient file with 60 coefficients has been transferred the needed format, namely hexadecimal address/hexadecimal coefficient), and a bit width of 17, perform the following steps.

1. Determine the redundant address that can store 32 bit standard check code, because the ROM C (romC) has a depth of 64 and 60 coefficients to be stored.

2. Because the ROM C (romC) has a bit width of 17, 2 addresses of the ROM C are needed for storing 32 bit standard check code. In the design tool software script, block the last 2 address (62-63) of the Read and Write address of the ROM C, that is to say, set the largest address to 61 in the control of the Read and Write address of the ROM C. (The Read and Write address range of the memory is 0-61.)

3. Produce self-test logic via MbistArchitect of Mentor, including 4 files: Compressor_lib.v, romC_bist.v, romC_bist_con.v, romC_tb.v.

4. Obtain 32 bits standard check code, write it into the last 2 lines of the romC_cof.txt (divide the 32 bit into 2 lines with 17 bit per line, add two 0s before the top 15 bit, and write them into the address 62 and bottom 17 bit into the address 63), and produce romC by using memory producing tool DROM_HSD.

What is claimed is:

1. A method of memory build-in self-test, comprising steps of:
   (a) determining whether there is redundant address in a ROM;
   (b) when there is redundant address for storing standard check code, transferring a coefficient file in said ROM to a predetermined format;
   (c) producing a self-test logic and a standard check code corresponding to said ROM via a design tool;
   (d) writing said standard check code into said redundant address and generating a new ROM.

2. The method of memory build-in self-test, as recited in claim 1, wherein said predetermined format is a format that a software tool needs to transfer said coefficient file.

3. The method of memory build-in self-test, as recited in claim 2, wherein when said software tool transfers said coefficient file, control of ROM Read and Write address should block a definition of said redundant address needed for storing check code, that is to say, in control of ROM Read and Write address, set the largest address to the difference value between the actual size of said ROM and the size for storing standard check code.

4. The method of memory build-in self-test, as recited in claim 1, wherein said self-test logic is an algorithm circuit of the memory build-in self-test.

5. The method of memory build-in self-test, as recited in claim 1, wherein said new ROM is produced by a memory producing tool.

* * * * *